(12) United States Patent
Barbier

(10) Patent No.: US 8,988,570 B2
(45) Date of Patent: Mar. 24, 2015

(54) METHOD OF CAPTURING AN IMAGE WITH AN IMAGE SENSOR

(71) Applicant: STMicroelectronics SA, Montrouge (FR)

(72) Inventor: Frederic Barbier, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 237 days.

(21) Appl. No.: 13/711,037

(22) Filed: Dec. 11, 2012

(65) Prior Publication Data

US 2013/0155303 A1 Jun. 20, 2013

(30) Foreign Application Priority Data

Dec. 19, 2011 (FR) .................................... 11 61869

(51) Int. Cl.
| | | |
|---|---|---|
| H04N 5/3745 | (2011.01) | |
| H04N 5/335 | (2011.01) | |
| H04N 3/14 | (2006.01) | |
| H04N 5/353 | (2011.01) | |
| H04N 5/355 | (2011.01) | |
| H01L 27/146 | (2006.01) | |

(52) U.S. Cl.
CPC ............... *H04N 5/335* (2013.01); *H04N 3/155* (2013.01); *H04N 5/3532* (2013.01); *H04N 5/3559* (2013.01); *H04N 5/37452* (2013.01); *H01L 27/14641* (2013.01)
USPC ....................................................... 348/294

(58) Field of Classification Search
CPC ....... H04N 5/341; H04N 5/369; H04N 5/374; H04N 5/353; H04N 5/3532; H04N 5/3741; H04N 5/3745; H04N 5/37452
USPC .................................. 348/294, 296, 302, 308
See application file for complete search history.

(56) References Cited

U.S. PATENT DOCUMENTS

| | | | |
|---|---|---|---|
| 6,809,766 B1 * | 10/2004 | Krymski et al. | ............... 348/296 |
| 2004/0079977 A1 | 4/2004 | Ying et al. | |
| 2006/0170804 A1 | 8/2006 | Kwon | |
| 2008/0231727 A1 | 9/2008 | Compton et al. | |

FOREIGN PATENT DOCUMENTS

| | | |
|---|---|---|
| WO | 2008115500 A2 | 9/2008 |
| WO | 2011074486 A1 | 6/2011 |

OTHER PUBLICATIONS

Tian et al., "Architecture and Development of Next Generation Small BSI Pixels," Aptina Imaging, San Jose, CA, Jun. 2013, 4 pages.

* cited by examiner

*Primary Examiner* — Timothy J Henn
(74) *Attorney, Agent, or Firm* — Allen, Dyer, Doppelt, Milbrath & Gilchrist, P.A.

(57) ABSTRACT

A method may include a cycle of reading a current pixel including connecting the capacitive node of the pixel to a capacitive node of a previous pixel already read, connecting the capacitive node of the current pixel and the capacitive node of a previous pixel to an output line, reading a first voltage of the capacitive node of the pixel through the output line, transferring charges from the accumulation node to the capacitive node of the pixel, reading a second voltage of the capacitive node of the pixel through the output line, and disconnecting the capacitive node from the capacitive node of a previous pixel, and a cycle of reading a next pixel. This cycle may include accumulating charges in the accumulation node of the next pixel while the capacitive node of the current pixel is connected to a capacitive node of a previous pixel.

14 Claims, 6 Drawing Sheets

METHOD OF CAPTURING AN IMAGE WITH AN IMAGE SENSOR

FIELD OF THE INVENTION

The present invention relates to a method of capturing an image using an image sensor.

BACKGROUND OF THE INVENTION

Typical image sensors comprise an array of pixels. Each pixel has a capacitive node to collect electrical charge generated at an accumulation node when it is exposed to incident light, and its sensitivity to light variations from one image to another depends on the capacitance of this capacitive node. FIG. 1 shows the structure of two adjacent pixels $P_{i,j}$, of a typical array of pixels AP0. Pixel $P_{i,j}$ belongs to a row of rank i, pixel $P_{i+1,j}$ belongs to a row of rank 1+1, and both belong to a column Cj. Each pixel comprises a photosensor PS (or photodetector) embedded in a semiconductor substrate, an accumulation node N0 formed by the cathode of the photosensor, and a capacitive node N1 having a capacitance IC shown in dotted lines as a capacitor. The capacitive node N1 is coupled to the accumulation node N0 through a transfer transistor TT, to a voltage VS through a reset transistor RT, and to an output line CLj through a source-follower transistor FT and an output transistor OT. The source-follower transistor FT has a gate connected to the capacitive node N1, a drain receiving voltage VS, and a source connected to a drain of the output transistor OT, which has a source connected to the output line CLj.

In a typical embodiment of a method of capturing an image with such an array of pixels, the pixels are read on a row-by-row basis with overlapping row read cycles. All the pixels of a selected row ("current row") are simultaneously read in one row read cycle comprising individual pixel read cycles. The pixels of the next row to be read ("next row") are subject to read cycles that overlap the read cycles of the pixels of the current row with a determined time offset.

FIG. 2 is a timing diagram of three logic control signals TS, RS, OS involved in a pixel read cycle. Signal TS is a transfer signal applied to a gate of the transfer transistor TT. Signal RS is a reset signal applied to a gate of the reset transistor RT. Signal OS is a readout signal applied to a gate of the output transistor OT. Each control signal is, for example, set to 1 when the corresponding transistor is set in the conducting state ("ON" state), and is set to 0 when the transistor is to be blocked ("OFF" state).

The read cycle is performed between times t0 and t9, and comprises intermediate times t1, t2 . . . t8 corresponding to rising or falling edges of some of the control signals. Signal TS is set to 1 from t2 to t3 and from t7 to t8. Signal RS is set to 1 from t9 of the previous pixel read cycle to t1, from t4 to t6, and from t9 to t1 of the next pixel read cycle. Signal OS is set to 1 from t5 to t10. The read cycle may comprise the following steps: S1: First reset of the capacitive node N1 (from t9 of the previous read cycle to t1 of the current read cycle): The reset transistor RT is ON and node N1 is tied to voltage VS. T1: First transfer of charges (from t2 to t3): The transfer transistor TT is ON, and the reset transistor RT is OFF. Electrical charges accumulated by the photosensor at node N0 are transferred to node N1. A1: Charge accumulation (from t3 to t7): The transfer transistor TS is OFF and electrical charges are accumulated at node N0. S2: Second reset of the capacitive node N1 (from t4 to t6): The reset transistor RT is ON and node N1 is tied to voltage VS. C1: Connection of node N1 to the output line CLj (from t5 to t10): The output transistor OT is ON and the capacitive node N1 is coupled to the output line through transistors FT, OT. R1: First read of node N1 (from t6 to t7): Transistors RT and TT are OFF and transistor OT is ON. The voltage at node N1 is transferred to line CLj through transistors FT and OT, and is read (i.e. sensed) by peripheral means connected to this line (not shown) T2: Second transfer of charges (from t7 to t8): The transfer transistor TT is ON, and the reset transistor RT is OFF. Electrical charges accumulated at node N0 during step A1 are transferred to node N1. R2: Second read of node N1 (from t8 to t9): The voltage at node N1 is transferred to line CLj through transistors FT and OT.

The voltage at the capacitive node N1 is thus read twice, once after the reset R1 and once after the transfer of charges T2, and is supplied to an image processing system for determination of a pixel data. It may happen that the lighting conditions present variations between extreme lighting conditions—from very bright lighting to very dark lighting—which are such that the capacitance of the capacitive node N1 is inappropriate for capturing an image in one of the extreme lighting conditions. If it has a small capacitance, the capacitive node N1 may not be able to receive all the electrical charges accumulated by node N0 in very bright conditions. Conversely, if it has a large capacitance, it may not be possible to differentiate small lighting variations in dark conditions since the voltage at node N1 varies too little from one transfer step to another to be properly sensed.

It may thus be desired to provide an image sensor with adjustable sensitivity, for improved functioning in both dark and bright lighting conditions. U.S. Patent Application Publication No 2008/0231727 discloses a method for adjusting the dynamic range of an image sensor on a pixel-by-pixel basis. The method may comprise integrating charges in a photodetector with the photodetector at a first capacitance, reading the resulting signal level at a first time with the photodetector at the first capacitance, changing the photodetector capacitance to a second capacitance, and reading the signal level associated with the photodetector at the second capacitance. To change the capacitance of the capacitive node, the node of a current pixel (pixel being read) is connected both to the capacitive node of a previous pixel (pixel previously read) and to the capacitive node of a next pixel (pixel to be read during a next pixel read cycle).

This method may be incompatible with overlapping read cycles since connecting the capacitive node of the current pixel (pixel being read) to the capacitive node of the next pixel (pixel to be read) prevents the next pixel from correctly performing the accumulation step due to crosstalk between photosensors. Even if its transfer transistor is OFF, the crosstalk may disturb the charge accumulation process of the next pixel when its capacitive mode is connected to the capacitive node of the current pixel.

In other respects, this method aims to extend the dynamic range of each pixel for a given image, by a real-time comparison of two voltage values corresponding to two capacitance values of the capacitive node, which amounts to extending the global dynamic range of the image sensor to accommodate large lighting variations within a single image. This may imply storing numerous voltage values for each pixel, two per capacitance value of the pixel, and post-processing of the voltage values to decide which one must be retained, thereby possibly necessitating powerful processing demands.

SUMMARY OF THE INVENTION

It may be desired to provide an image capture method that is simple to implement while allowing the sensitivity of pixels to be set for a given image.

It also may be desired to provide an image sensor having a variable sensitivity, which can be adjusted from one image to another, to adapt the sensitivity of the array of pixels or parts thereof to the overall brightness of the captured image.

An aspect of the present disclosure is directed to a method of capturing at least one image with an array of pixels, each pixel comprising a photosensitive accumulation node and a capacitive node. The method may comprise a cycle of reading a current pixel comprising: connecting the capacitive node of the pixel to at least one capacitive node of a previous pixel already read, reading a first voltage of the capacitive node of the pixel, transferring charges from the accumulation node to the capacitive node of the pixel, reading a second voltage of the capacitive node of the pixel, and disconnecting the capacitive node from the at least one capacitive node of a previous pixel. The method may also comprise a cycle of reading a next pixel, the cycle overlapping the cycle of reading a current pixel and comprising accumulating charges in the accumulation node of the next pixel while the capacitive node of the current pixel is connected to at least one capacitive node of a previous pixel.

According to some embodiments, the method may comprise resetting the capacitive node of the next pixel while the capacitive node of the current pixel is connected to at least one capacitive node of a previous pixel. According to another embodiment, the method may comprise capturing a first image without connecting the capacitive node of each current pixel to a capacitive node of a previous pixel, analyzing the image, and depending on the result of the analysis, capturing a second image with connecting the capacitive node of at least one current pixel to at least one capacitive node of a previous pixel or capturing the second image without connecting the capacitive node of each current pixel to a capacitive node of a previous pixel.

According to one embodiment, the method may comprise before accumulating charges in the accumulation node of the current pixel, resetting the capacitive node of the current pixel, and transferring charges from the accumulation node to the capacitive node of the current pixel, to reset the accumulation node. According to another embodiment, each capacitive node may be coupled to the output line through a source-follower transistor and an output transistor, and coupling a capacitive node to the output line may comprise setting the output transistor in a conducting state.

According to other embodiments, the method may comprise resetting the at least one capacitive node of a previous pixel while the output transistor is set in a conducting state, and resetting the capacitive node of the at least one previous pixel while the output transistor is then set in a non-conducting state. According to yet another embodiment, the resetting of a capacitive node may comprise applying a determined voltage to the capacitive node. Also, the pixels may be arranged in rows and columns, and the method may comprise capturing the image row-by-row with overlapping row read cycles each comprising a plurality of pixel read cycles, and selecting the at least one previous pixel in a previously read row and in the same column as the current pixel.

Another aspect is directed to an imaging device comprising an array of pixels, and control means or a controller to select and read pixels of the array of pixels. Each pixel may comprise a photosensitive accumulation node and a capacitive node. The controller may be configured to perform the method of capturing at least one image with the array of pixels. Additionally, the controller may be configured to reset the capacitive node of the next pixel while the capacitive node of the current pixel is connected to at least one capacitive node of a previous pixel.

According to some embodiments, the controller may be configured to capture a first image without connecting the capacitive node of each current pixel to a capacitive node of a previous pixel, analyze the image, and depending on the result of the analysis, capture a second image by connecting the capacitive node of at least one current pixel to at least one capacitive node of a previous pixel or capture the second image without connecting the capacitive node of each current pixel to a capacitive node of a previous pixel. Also, the pixels may be arranged in rows and columns, and the controller may be configured to capture the image row-by-row with overlapping row read cycles comprising each a plurality of pixel read cycles, and select the at least one previous pixel in a previously read row and in the same column as the current pixel. According to one embodiment, each capacitive node may be coupled to the output line through a source-follower transistor and an output transistor, and connecting a capacitive node to the output line comprises setting the output transistor in a conducting state.

BRIEF DESCRIPTION OF THE DRAWINGS

Embodiments of the present invention will now be described in connection with, but not limited to, the appended drawings in which.

DETAILED DESCRIPTION OF THE PREFERRED EMBODIMENTS

Figure 1:
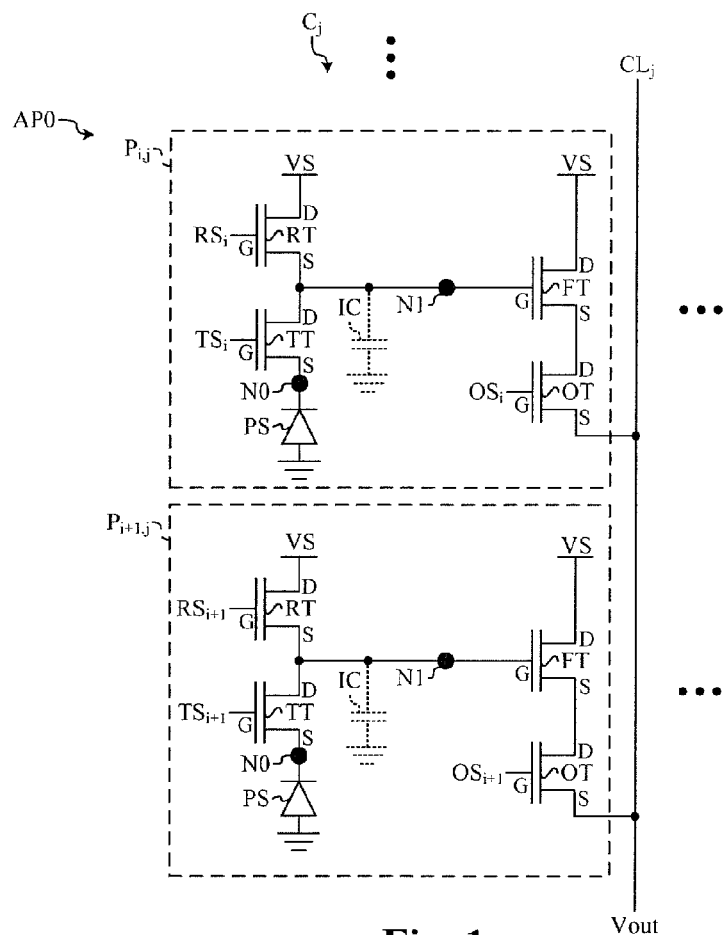
FIG. 1 is a pixel structure in an array of pixels, according to the prior art.
Figure 2:
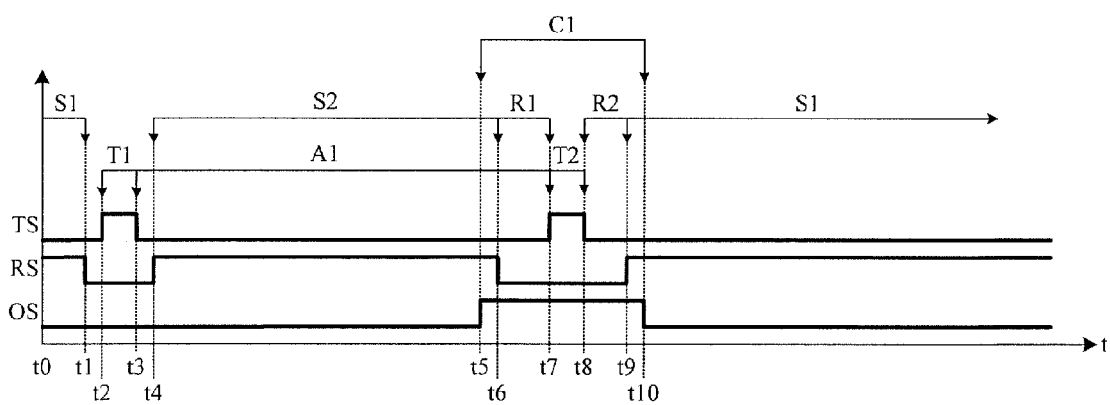
FIG. 2 is a timing diagram of a pixel read cycle, according to the prior art.
Figure 3:
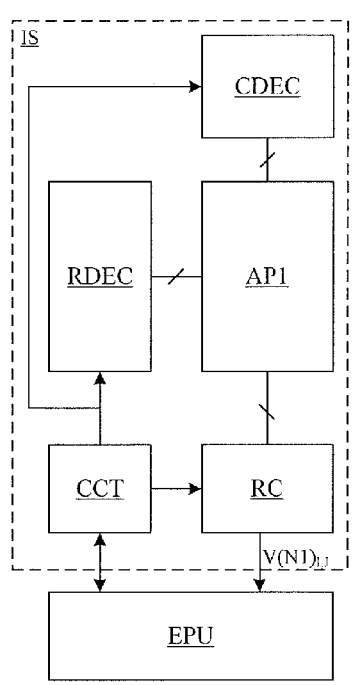
FIG. 3 is a schematic block diagram of an image sensor comprising an array of pixels, according to the present invention.

FIG. 3 shows an image sensor IS according to an embodiment of the present invention. The image sensor IS comprises an array of pixels AP1, a row decoder RDEC, a column decoder CDEC, readout circuitry RC, and a control circuit CCT. The control circuit CCT and the readout circuitry RC are coupled to an external processing unit EPU. Embodiments AP11, AP12, AP13 of the array of pixels AP1 will be described hereinafter in connection with FIGS. 4, 7, and 8. It will be noted that the column decoder CDEC is optional and only used in connection with the array of pixels AP13 of FIG. 8.

Figure 4:
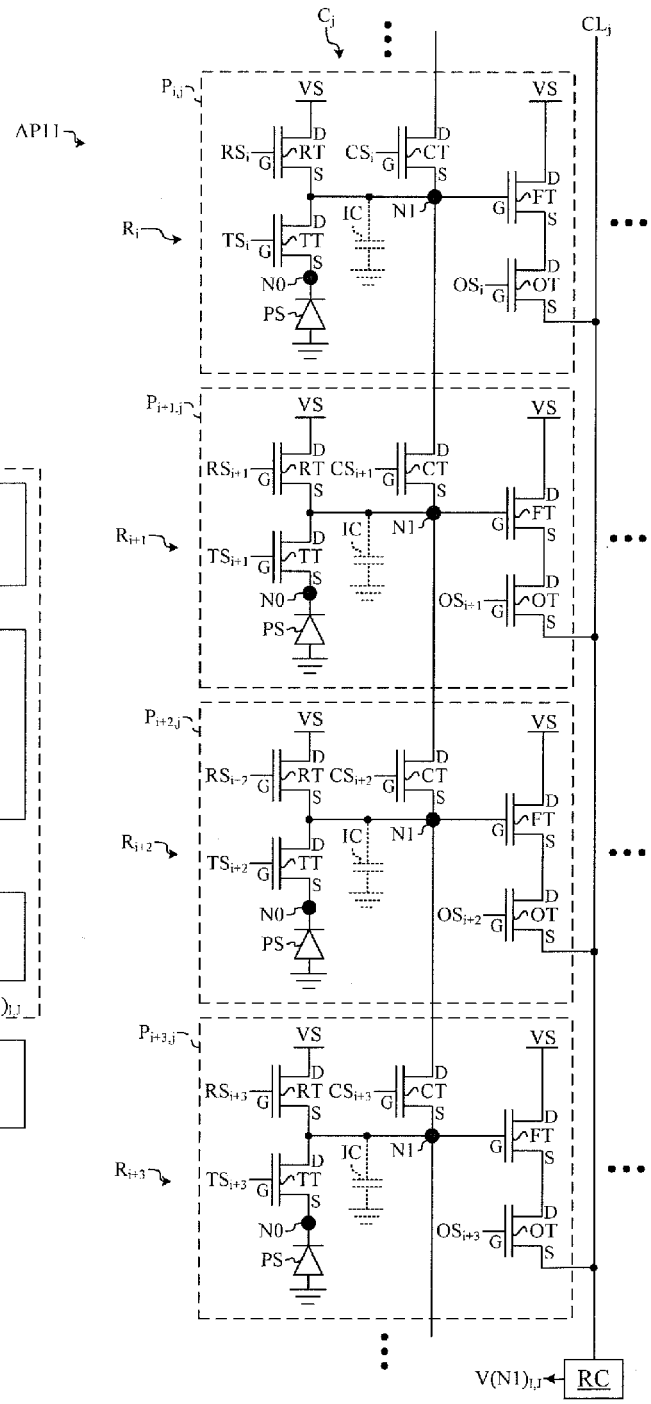
FIG. 4 is a portion of an embodiment of the array of pixels of FIG. 3.

As shown in FIG. 4, the array of pixels API comprises pixels $P_{i,j}$ arranged in rows $R_i$ of rank i and in columns $C_j$ of rank j. Only four pixels $P_{i,j}$, $P_{i+1,j}$, $P_{i+2,j}$, $P_{i+3,j}$ belonging to rows $R_i$, $R_{i+1}$, $R_{i+2}$, $R_{i+3}$ and to a column Cj are shown, as well as output line $CL_j$ allocated to column $C_j$. Each pixel P comprises a photosensor PS, shown as a photodiode, embedded in a semiconductor substrate, an accumulation node N0 formed by the cathode of the photosensor PS, and a capacitive node N1. The capacitive node N1 is coupled to the accumulation node N0 through a transfer transistor TT, to a voltage VS through a reset transistor RT, and to an output line CLj through a source-follower transistor FT and an output transistor OT. The source-follower transistor FT has a gate connected to the capacitive node N1, a drain receiving voltage VS, and a source connected to a drain of the output transistor OT, which has a source connected to the output line CLj. The readout circuitry RC is connected to the output lines CLj and provides voltages $V(N1)_{i,j}$ read on the capacitive nodes N1 of the different pixels of column $C_j$.

The capacitive node N1 has a capacitance shown with dotted lines as a capacitor IC, which may be an intrinsic capacitance of node N1, for example, if node N1 comprises a floating diffusion (doped semi-conductor region). Generally speaking, node N0, transistor TT, and node N1 together form charge-to-voltage conversion means or a charge conversion circuit. Transistor TT may be a simple transfer gate between a first semiconductor region forming node N0 and a second semiconductor region forming node N1, instead of a complete transistor with source and drain regions.

Each pixel also comprises a connection transistor CT which couples its capacitive node N1 to the capacitive node N1 of a previous pixel. By "previous," it is meant here a pixel read before the considered pixel during an image capture, and which belongs to another row. By convention, rows will be read here in increasing rank order, and a "previous" pixel is a pixel in a row having a rank i inferior to that of the considered row. In one embodiment, the previous pixel is located in the same column as the considered pixel. In the embodiment shown in FIG. 4, and pixel $P_{i+3,j}$ has a connection transistor CT, which couples its node N1 to node N1 of pixel $P_{i+2,j}$; pixel $P_{i+2,j}$ has a connection transistor CT, which couples its node N1 to node N1 of pixel $P_{i+1,j}$; and pixel has a connection transistor CT, which couples its node N1 to node N1 of pixel $P_{i,j}$, and so forth.

At the upper edge of the array of pixels (not shown), nodes N1 of the first row of pixels cannot be, in principle, coupled to the nodes of pixels of a previous row since there are no previous rows. However, in some embodiments, the array may comprise one or more dummy rows, i.e. rows of pixels which are not controlled by the row decoder. In that case, the nodes of the pixels of the first row may be coupled to the nodes N1 of the pixels present in such dummy rows.

Referring again to FIG. 3, the array of pixels AP11 is coupled to the row decoder RDEC and to the readout circuitry RC, which are both coupled to circuit CCT. Circuit CCT is configured to select and read the pixels on a row-by-row basis with overlapping row read cycles, by way of the row decoder and the readout circuitry. In an embodiment, all the pixels of a selected row ("current row") are simultaneously selected and read in a row read cycle comprising simultaneous pixel read cycles. The reading of the pixels of a row is performed by way of the readout circuitry RC, through different output lines CLj.

Once an image has been captured, the external processing unit EPU analyzes the different voltages $V(N1)_{i,j}$ read on the capacitive nodes N1 of the different pixels $P_{i,j}$, and decides whether the capacitive nodes N1 must be connected to one or more capacitive nodes N1 of one or more previously read pixels, to increase their capacitance. The decision to connect or not to connect additional capacitive nodes is communicated to control circuit CCT and executed by the latter during the next read cycle.

For example, if the different voltages $V(N1)_{i,j}$ are high and close to a saturation value, the external processing unit EPU may decide to connect the capacitive node of each pixel to the capacitive node of a previous pixel, to extend its capacitance. If the different voltages $V(N1)_{i,j}$ remain high and close to the saturation value when the next image is captured, or after several image captures, the external processing unit EPU may decide to connect the capacitive node N1 of each pixel to an additional capacitive node of a further previous pixel.

In some embodiments, voltages $V(N1)_{i,j}$ may be compared to different threshold voltages and the external processing unit EPU may decide to connect one additional capacitive node N1 to the capacitive node N1 of each pixel if voltages $V(N1)_{i,j}$ are greater than a first threshold, two additional capacitive nodes N1 to the capacitive node N1 of each pixel if voltages $V(N1)_{i,j}$ are greater than a second threshold, and so forth.

Figure 5:
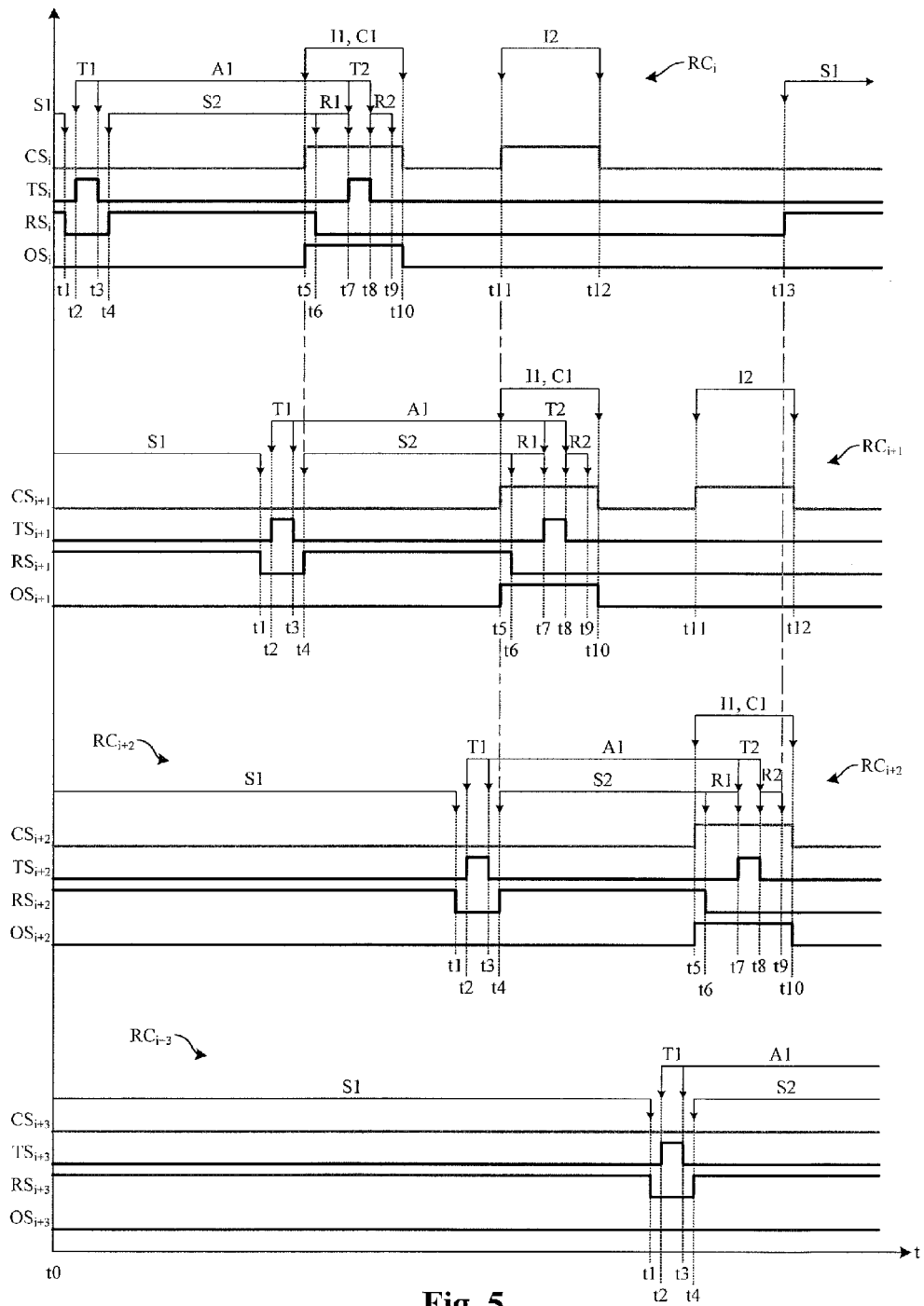
FIG. 5 is a timing diagram of an embodiment of a method of capturing an image comprising overlapping pixel read cycles, according to the present invention.

FIG. 5 is a timing diagram showing one embodiment of pixel read cycles $RC_I$ ($RC_i$, $RC_{i+1}$, $RC_{i+2}$, $RC_{i+3}$) performed on pixels $P_{i,j}$, $P_{i+1,j}$, $P_{i+2,j}$, $P_{i+3,j}$ shown in FIG. 4, respectively. For each pixel, FIG. 5 shows four logic control signals TS, RS, OS, CS involved in the read cycle of each pixel and supplied by the row decoder RDEC. The control signals applied to the different pixels are differentiated each other by their rank "i" (from $TS_i$, $RS_i$, $OS_i$, $CS_i$ for pixel $P_{i,j}$ to $TS_{i+3}$, $RS_{i+3}$, $OS_{i+3}$, $CS_{i+3}$ for pixel $P_{i+3,j}$): TS is a transfer signal applied to a gate of the transfer transistor TT; RS is a reset signal applied to a gate of the reset transistor RT; OS is a readout signal applied to a gate of the output transistor OT; and CS is a connection signal applied to a gate of the connection transistor CT, to connect the capacitive node N1 of the considered pixel to the capacitive node of a previous pixel.

Each control signal is set to 1 when the corresponding transistor must be set in the conducting state (ON state), and is set to 0 when the transistor must be blocked ("OFF" state). Each read cycle is performed between times t0 and t13, and comprises intermediate times t1, t2, . . . t12 corresponding to rising or falling edges of some of the control signals: TS is set to 1 from t2 to t3 and from t7 to t8; RS is set to 1 from t13 of the precedent read cycle to t1, from t4 to t6, and from t13 to t1 of the next read cycle; OS is set to 1 from t5 to t10; and CS is set to 1 from t5 to t10 and from t11 to t12.

The read cycles shown in FIG. 5 correspond to the case when the external processing unit EPU has decided to connect the capacitive node N1 of each pixel P to two nodes N1 of previous pixels. The read cycles therefore comprise, for each current pixel, the following steps:

S1: First reset of the capacitive node N1 (from t13 of previous read cycle to t1): The reset transistor RT is ON and node N1 is tied to voltage VS.

T1: First transfer of charges (from t2 to t3): The transfer transistor TT is ON, and the reset transistor RT is OFF. Electrical charges previously accumulated by the photosensor at node N0 are transferred to node N1. This step amounts to resetting node N0 by transferring its electrical charge to node N1 after resetting thereof.

A1: Charge accumulation (from t3 to t7): The transfer transistor TS is OFF and electrical charges are accumulated at node N0, whatever the state of the reset transistor RT.

S2: Second reset of the capacitive node N1 (from t4 to t6): The reset transistor RT is ON and node N1 is tied to voltage VS.

I1: Connection of node N1 to at least one capacitive node N1 of a previous pixel (from t5 to t10): Transistor CT is ON and the capacitive node N1 is connected to the capacitive node N1 of a previous pixel, here two previous pixels, so that its capacitance is increased.

C1: Connection of node N1 to the output line CLj (from t5 to t10) by setting the output transistor OT in a conducting state (Cf. FIG. 4).

R1: First read of node N1 (from t6 to t7): Transistors RT and TT are OFF and transistor OT is ON. The voltage at node N1, which has just been reset, is transferred to line CLj through transistors FT and OT and is read by the readout circuitry RC (for the sake of simplicity, the threshold voltages of transistors FT, OT are considered to be zero).

T2: Second transfer of charges (from t7 to t8): The transfer transistor TT is ON, and the reset transistor RT is OFF. Electrical charges accumulated by the photosensor at node N0 during step A1 are transferred to node N1.

R2: Second read of node N1 (from t8 to t9): Transistors RT and TT are OFF and transistor OT is ON. The voltage at node N1 is transferred to line CLj through transistors FT and OT and is read by the readout circuitry RC.

I2: Connection of node N1 to at least one capacitive node N1 of a previous pixel (from t11 to t12): Transistor CT is ON, and the capacitive node N1 is connected to the capacitive node N1 of a previous pixel.

It appears in FIG. 5 that each succeeding read cycle overlaps the precedent read cycle so that step I1 is performed at the same time as step I2 of the precedent cycle. Therefore, referring, for example, to the read cycle $RC_{i+2}$ of pixel $P_{i+2,j}$, steps R1, T2, R2 of cycle $RC_{i+2}$ occur when the node N1 of the current pixel $P_{i+2,j}$ is connected to the node N1 of the previous pixel $P_{i+1,j}$ ($CS_{i+2}=1$), which is itself connected to the node N1 of the previous pixel $P_{i,j}$ ($CS_{i+1}=1$).

Although step I2 has been presented as a step of the read cycle of a given pixel by commodity, strictly speaking, step I2 belongs to the read cycle of the next pixel, which has its node N1 connected to node N1 of the given pixel, since the reading of the given pixel is finished when step I2 has been performed. Step I2 allows the node of the next pixel, when it is the current pixel, to be connected to the node N1 of a pixel which is the previous pixel with respect to the given pixel, when the next pixel undergoes steps R1, T2, R2. Indeed, if the external processing unit EPU has decided to connect a current pixel to only one node N1 of a previous pixel instead of two, step I2 is not performed.

As to the overlapping of the different pixel read cycles, it can be noted that time $t5_i$ (i.e. t5 of cycle $RC_i$) is equal to $t4_{i+1}$ (i.e. time t4 of cycle $RC_{i+1}$) and that $t11_i=t5_{i+1}$. Also, $t13_1=t9_{i+2}$, which means that node N1 of pixel $P_{i,j}$ is not reset (beginning of step S1) until step R2 of pixel $P_{i+2,j}$ has been achieved. It will also be understood that the node N1 of a pixel undergoing a read cycle is never connected to the node N1 of a next pixel, which is beginning a read cycle. More particularly, when read step R1, transfer step T2, then read step R2 are applied to a pixel, the next pixel has its node N0 undergoing the accumulation step A1 and its node N1 undergoing the reset step S2. For example, while steps R1, T2, R2 are performed on pixel $P_{i+1,j}$ (read cycle $RC_{i+1}$), node N0 of pixel $P_{i+2,j}$ (read cycle $RC_{i+2}$) is undergoing the accumulation step A1, and node N1 of that pixel is undergoing the reset step S2.

In other embodiments, the reset step S2 of the next pixel may be postponed, for example, until steps R1, T2, R2 of the current pixel have been performed. In that case, signal RS would be set to 1 at time t10 of the read cycle of the previous pixel, instead of being set to 1 at time t4 of the read cycle of the considered pixel. In some embodiments, the external processing unit EPU may be configured to extend the capacitance of the pixels on a row-by-row basis, instead of setting the entire array of pixels at a given capacitance. In that case, the previously captured image is analyzed row by row, to determine which rows must have the capacitances of their pixels extended.

Figure 6:
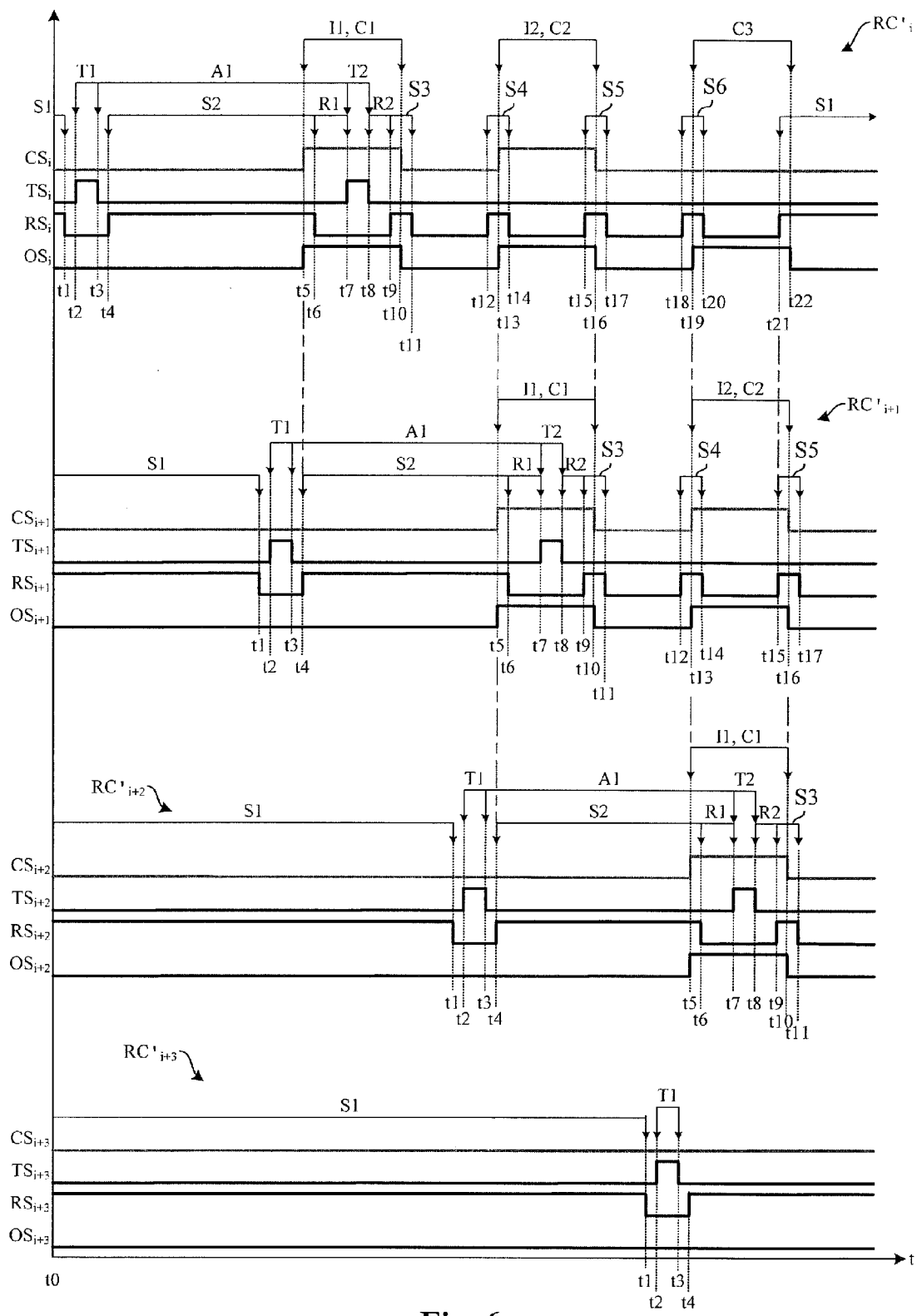
FIG. 6 is a timing diagram of another embodiment of an image capture method comprising overlapping pixel read cycles, according to the present invention.

FIG. 6 is a timing diagram showing another embodiment of pixel read cycles $RC'_I$ ($RC'_i$, $RC'_{i+1}$, $RC'_{i+2}$, $RC'_{i+3}$) performed on pixels $P_{i,j}$, $P_{i+1,j}$, $P^{i+2,j}$, $P_{i+3,j}$ shown in FIG. 4. For each pixel, the control circuit CCT supplies the four logic control signals TS, RS, OS, CS previously described with a timing different than that of FIG. 5, which comprises times t0 to t22:

TS is set to 1 from t2 to t3 and from t7 to t8,

RS is set to 1 from t21 (of the precedent read cycle) to t1, from t4 to t6, from t9 to t11, from t12 to t14, from t15 to t17, from t18 to t20, and from t21 to t1 of the next read cycle, OS is set to 1 from t5 to t10, from t13 to t16, and from t19 to t22, and CS is set to 1 from t5 to t10 and from t13 to t16.

It is again assumed in this example that the external processing unit EPU has decided to connect the capacitive node N1 of each pixel to two nodes N1 of previous pixels. The read cycle therefore comprises the following steps, for each current pixel:

Step S1: First reset of node N1 (from t21 of previous cycle to t1),

T1: First transfer of charges (from t2 to t3),

A1: Charge accumulation (from t3 to t7),

S2: Second reset of node N1 (from t4 to t6),

I1: Connection of node N1 to at least one capacitive node of a previous pixel (from t5 to t10), C1: Connection of node N1 to the output line CLj (from t5 to t10), R1: First read of node N1 (from t6 to t7), T2: Second transfer of charges (from t7 to t8), R2: Second read of node N1 (from t8 to t9), S3: Third reset of node N1 (from t9 to t11), S4: Fourth reset of node N1 (from t12 to t14), I2: Connection of node N1 to at least one capacitive node N1 of a previous pixel (from t13 to t16), C2: Connection of node N1 to the output line CLj (from t13 to t16), S5: Fifth reset of node N1 (from t15 to t17), S6: Sixth reset of node N1 (from t18 to t20), and C3: Connection of node N1 to the output line CLj (from t19 to t22).

It can be seen that read cycles $RC'_I$ differ from read cycles $RC_I$ in that the output transistor OT of a previously read pixel is also set in the ON state during steps C2, C3, when the output transistor OT of the current pixel is set in the ON state and when the node N1 of the previous pixel is connected to the node N1 of the current pixel. It follows that all the interconnected nodes N1 are simultaneously coupled to the output line $CL_j$. This allows a faster reading of the voltage V(N1) of the node N1 of the current pixel through the output transistor of the current pixel and through the output transistors of the previous pixels to which it is connected. This also diminishes the read noise because the interconnection of the nodes forms an equivalent output transistor having a larger area, and allows a better capacitance matching between nodes N1.

For example, during step C1 of the read cycle $RC'_{i+2}$ of pixel $P_{i+2,j}$, pixel is undergoing step C2 and pixel $P_{i,j}$ is undergoing step C3. Obviously, if node N1 of pixel $P_{i,j}$ was not to be connected to node N1 of pixel $P_{i+1,j}$ (decided by the external processing unit EPU), step C3 would not be performed on that pixel.

According to one aspect of this embodiment, each node N1 undergoes the reset step S4, S6 each time the corresponding output transistor OT is switched from the OFF state to the ON state (signal OS goes from 0 to 1) and undergoes the reset step S3, S5 each time the corresponding output transistor OT is switched from the ON state to the OFF state (signal OS goes from 1 to 0).

Figure 7:
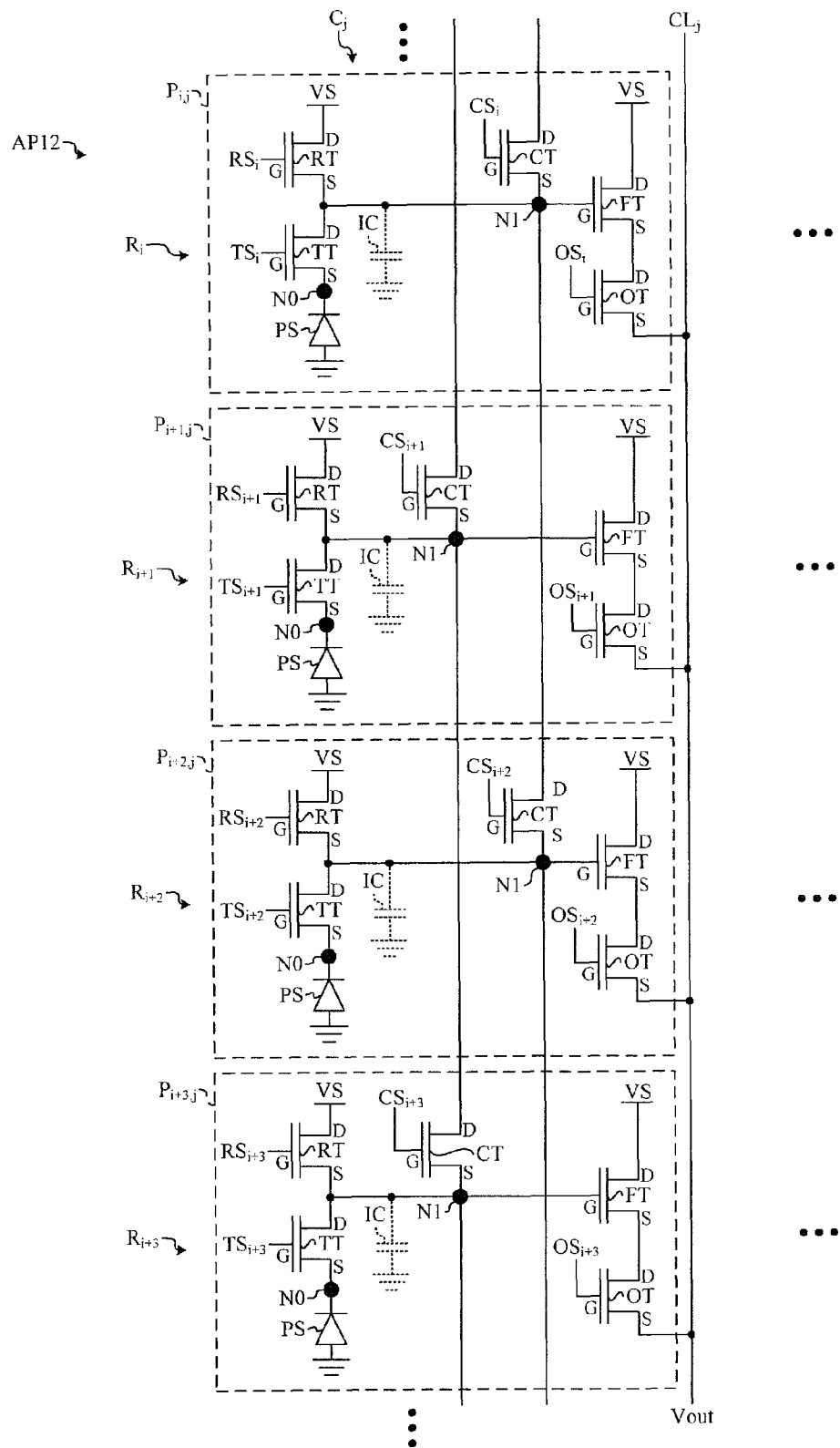
FIG. 7 is a portion of another embodiment of the array of pixels of FIG. 3.

FIG. 7 shows another embodiment AP12 of the array of pixels AP1. Only four pixels $P_{i,j}$, $P_{i+1,j}$, $P_{i+2,j}$, $P_{i+3,j}$ belonging to rows $R_i$, $R_{i+1}$, $R_{i+2}$, $R_{i+3}$ and to a column Cj are shown. Array AP12 differs from array AP11 in that the node N1 of each pixel, instead of being coupled to the node N1 of a pixel located in a previous adjacent row, is coupled to the node N1 of a pixel located in a row which is previous to the previous adjacent row. For example, pixel $P_{i+3,j}$ has a connection transistor CT which couples its node N1 to node N1 of pixel $P_{i+1,j}$ instead of to node N1 of pixel $P_{i+2,j}$; pixel $P_{i+2,j}$ has a connection transistor CT which couples its node N1 to node N1 of pixel $P_{i,j}$ instead of to node N1 of pixel $P_{i+1,j}$, and so forth. Thus, according to some embodiments of the invention, a "previous" pixel is not necessarily located in an adjacent row.

Figure 8:
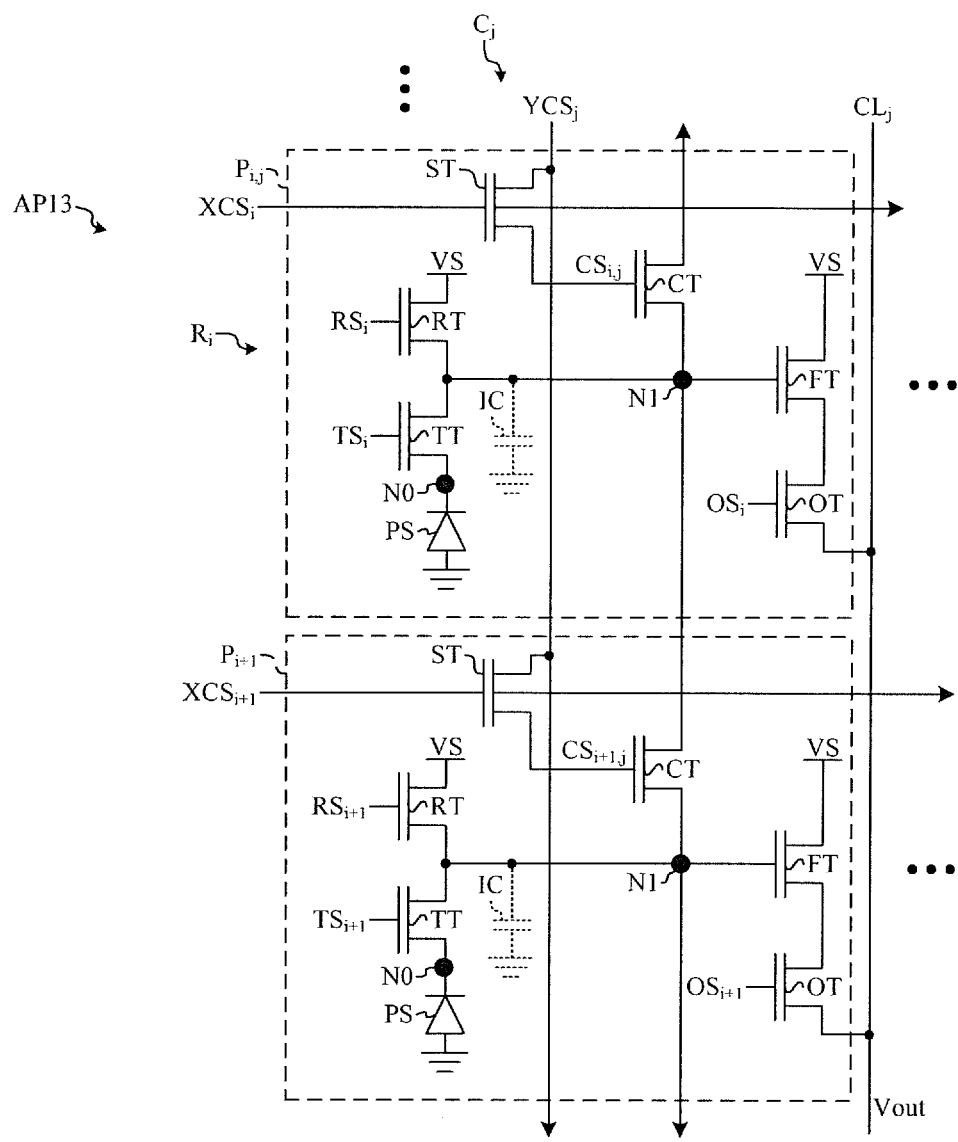
FIG. 8 is a portion of another embodiment of the array of pixels of FIG. 3.

FIG. 8 shows yet another embodiment AP13 of the array of pixels AP1. Only two pixels $P_{i,j}$, $P_{i+1,j}$ are shown. Each pixel P differs from a pixel of FIG. 4 in that it comprises a select transistor ST whose source supplies the connection signal CS of rank I,J ($CS_{i,j}$, $CS_{i+1,j}$) to the gate of the connection transistor CT. The select transistor ST receives on its gate a first connection signal XCS of rank I ($XCS_i$, $XCS_{i+1}$) supplied by the row decoder RDEC, and on its drain a second connection signal YCS of rank J ($YCS_j$, $YCS_{j+1}$) supplied by the column decoder CDEC (Cf. FIG. 3). When both signals XCS, YCS are set to 1, the resulting connection signal CS is at 1, and the node N1 of the pixel is connected to the node N1 of the previous pixel.

Due to these double control signals, the external processing unit EPU may be configured to divide the array of pixels AP1 into different sectors and decide to connect node N1 of each pixel to one or more nodes N1 of previous pixels on a sector-by-sector basis. In that case, a sector is defined as the intersection of one or more rows of pixels and one or more columns of pixels and may comprise a single pixel.

In summary, an image sensor IS according to the embodiments presents variable pixel sensitivity due to the adjustable capacitance of the capacitive nodes N1 of its pixels. In dark lighting conditions, the capacitance of the capacitive nodes N1 should be as small as possible and thus the node N1 of a pixel should not be connected to capacitive nodes of previous pixels, the intrinsic capacitance IC of each node N1 being sufficient to receive the charges accumulated by the corresponding accumulation node N0. In that case, the external processing unit EPU captures an image normally. If the brightness of the following images increase until a saturation threshold is reached, the external processing unit EPU then increases the capacitance of nodes N1 by connecting them to one or more nodes N1 of previous pixels, to allow more electrical charges to be collected.

It will be apparent to the skilled person that the present embodiments are susceptible to various other embodiments and applications. In particular, they may be applied to a pixel architecture known as "2T5" which comprises two photosensors coupled to a same capacitive node by two transfer transistors. Color filters may be arranged over the array of pixels to provide filtering of incident light according to the color, for example, according to the Bayer pattern, which comprises green, red, and blue color filters. Dark current prevention means or devices can be supplied, for example, applying a negative voltage to the gate G of transfer transistor TT during the charge accumulation phase.

That which is claimed is:

1. A method for capturing an image with an array of pixels, each pixel comprising a photosensitive accumulation node, and a capacitive node coupled thereto, the method comprising:
    capturing a first image without connecting a capacitive node of a current pixel to at least one capacitive node of previous pixels;
    analyzing the first image; and
    based upon a result of the analysis of the first image, capturing a second image by performing at least:
        a cycle of reading the current pixel comprising
            connecting the capacitive node of the current pixel to the at least one capacitive node of the previous pixels already read,
            coupling the capacitive node of the current pixel to an output line,
            coupling the at least one capacitive node of the previous pixels to the output line,
            reading a first voltage of the capacitive node of the current pixel through the output line,
            transferring charge from an accumulation node to the capacitive node of the current pixel,
            reading a second voltage of the capacitive node of the current pixel through the output line, and
            disconnecting the capacitive node of the current pixel from the at least one capacitive node of the previous pixels; and
        a cycle of reading a next pixel overlapping the cycle of reading the current pixel and comprising accumulating charge in an accumulation node of the next pixel while the capacitive node of the current pixel is connected to the at least one capacitive node of the previous pixels.

2. The method according to claim 1 further comprising resetting a capacitive node of the next pixel while the capacitive node of the current pixel is connected to the at least one capacitive node of the previous pixels.

3. The method according to claim 1 further comprising before accumulating charges in the accumulation node of the current pixel:
    resetting the capacitive node of the current pixel; and
    transferring charge from the accumulation node to the capacitive node of the current pixel, to reset the accumulation node.

4. The method according to claim 1 wherein each capacitive node is coupled to the output line through a source-follower transistor and an output transistor set in a conducting state.

5. The method according to claim 4 further comprising:
    resetting the at least one capacitive node of the previous pixels while the output transistor is set in a conducting state; and
    resetting the at least one capacitive node of the previous pixels while the output transistor is then set in a non-conducting state.

6. The method according to claim 5 wherein resetting the at least one capacitive node comprises applying a set voltage to the at least one capacitive node.

7. The method according to claim 1 wherein the array of pixels is arranged in rows and columns; and further comprising:
    capturing the image row-by-row with overlapping row read cycles, each row read cycle comprising a plurality of pixel read cycles; and
    selecting the previous pixels in a previously read row and in a same column as the current pixel.

8. A method for capturing an image with an array of pixels, each pixel comprising a photosensitive accumulation node, and a capacitive node coupled thereto, the method comprising:
- capturing a first image without connecting a capacitive node of a current pixel to at least one capacitive node of previous pixels;
- analyzing the first image;
- based upon a result of the analysis of the first image, capturing a second image by:
  - reading the current pixel comprising
    - connecting the capacitive node of the current pixel to the at least one capacitive node of the previous pixels already read, and
    - reading a first voltage of the capacitive node of the current pixel; and
  - reading a next pixel overlapping the reading of the current pixel and comprising accumulating charge in an accumulation node of the next pixel while the capacitive node of the current pixel is connected to the at least one capacitive node of the previous pixels.

9. The method according to claim 8 further comprising resetting a capacitive node of the next pixel while the capacitive node of the current pixel is connected to the at least one capacitive node of the previous pixels.

10. An imaging device comprising:
- an array of pixels; and
- a readout circuitry configured to select and read said array of pixels, each pixel comprising a photosensitive accumulation node, and a capacitive node coupled thereto;
- said readout circuitry configured to:
  - capture a first image without connecting a capacitive node of a current pixel to at least one capacitive node of previous pixels;
  - analyze the first image;
  - based upon a result of the analysis of the first image, capture a second image by performing at least
    - a cycle of reading the current pixel comprising
      - connecting the capacitive node of the current pixel to the at least one capacitive node of the previous pixels already read,
      - coupling the capacitive node of the current pixel to an output line,
      - coupling the at least one capacitive node of the previous pixels to the output line,
      - reading a first voltage of the capacitive node of the current pixel through the output line,
      - transferring charge from an accumulation node to the capacitive node of the current pixel,
      - reading a second voltage of the capacitive node of the current pixel through the output line, and
      - disconnecting the capacitive node of the current pixel from the at least one capacitive node of the previous pixels, and
    - a cycle of reading a next pixel overlapping the cycle of reading the current pixel and comprising accumulating charge in an accumulation node of the next pixel while the capacitive node of the current pixel is connected to the at least one capacitive node of the previous pixels.

11. The imaging device according to claim 10 wherein said readout circuitry is configured to reset the capacitive node of the next pixel while the capacitive node of the current pixel is connected to the at least one capacitive node of the previous pixels.

12. The imaging device according to claim 10 wherein said array of pixels is arranged in rows, and columns; and wherein said readout circuitry is configured to:
- capture the image row-by-row with overlapping row read cycles, each row read cycle comprising a plurality of pixel read cycles; and
- select the previous pixels in a previously read row and in a same column as the current pixel.

13. An imaging device comprising:
- an array of pixels; and
- a readout circuitry configured to select and read said array of pixels, each pixel comprising a photosensitive accumulation node, and a capacitive node coupled thereto;
- said readout circuitry configured to:
  - capture a first image without connecting a capacitive node of a current pixel to at least one capacitive node of previous pixels;
  - analyze the first image; and
  - based upon a result of the analysis of the first image, capture a second image by at least
    - reading the current pixel comprising
      - connecting the capacitive node of the current pixel to the at least one capacitive node of the previous pixels already read, and
      - reading a first voltage of the capacitive node of the current pixel,* and
    - reading a next pixel overlapping the reading of the current pixel and comprising accumulating charge in an accumulation node of the next pixel while the capacitive node of the current pixel is connected to the at least one capacitive node of the previous pixels.

14. The imaging device according to claim 13 wherein said readout circuitry is configured to reset the capacitive node of the next pixel while the capacitive node of the current pixel is connected to the at least one capacitive node of the previous pixels.

* * * * *